(12) United States Patent
Chen et al.

(10) Patent No.: US 7,314,344 B2
(45) Date of Patent: Jan. 1, 2008

(54) SUBSTRATE-TRANSPORTING DEVICE

(75) Inventors: Ching Chih Chen, Gueishan Township, Taoyuan County (TW); Tai Hsing Lee, Gueishan Township, Taoyuan County (TW)

(73) Assignee: Quanta Display Inc., Tao Yuan Shien (TW)

( * ) Notice: Subject to any disclaimer, the term of this patent is extended or adjusted under 35 U.S.C. 154(b) by 557 days.

(21) Appl. No.: 10/914,143

(22) Filed: Aug. 10, 2004

(65) Prior Publication Data

US 2005/0276680 A1 Dec. 15, 2005

(30) Foreign Application Priority Data

May 27, 2004 (TW) ............................... 93114975 A (51) Int. Cl.
*B07C 1/18* (2006.01)
*B65G 47/22* (2006.01)
*B65F 9/00* (2006.01)

(52) U.S. Cl. ...................... 414/763; 414/777; 414/351; 414/936; 414/222.04

(58) Field of Classification Search ............. 414/749.1, 414/752.1, 222.04, 222.05, 222.06, 351, 414/936, 396, 401, 761, 763, 765, 766, 767, 414/771, 774, 777, 779, 782; 198/861.1, 198/689.1, 463.3; 108/55.3; 294/86.4, 2

See application file for complete search history.

(56) References Cited

U.S. PATENT DOCUMENTS

| | | | | |
|---|---|---|---|---|
| 4,047,625 A | * | 9/1977 | Grant | 414/651 |
| 4,538,950 A | * | 9/1985 | Shiomi et al. | 414/222.06 |
| 4,818,171 A | * | 4/1989 | Burkholder | 414/497 |
| 4,903,717 A | * | 2/1990 | Sumnitsch | 134/99.1 |
| 5,964,568 A | * | 10/1999 | Codatto | 414/751.1 |
| 6,012,192 A | * | 1/2000 | Sawada et al. | 15/77 |
| 2002/0172585 A1 | * | 11/2002 | Graf et al. | 414/757 |

* cited by examiner

*Primary Examiner*—Saul Rodriguez
*Assistant Examiner*—Gregory W Adams
(74) *Attorney, Agent, or Firm*—Bacon & Thomas, PLLC (57) ABSTRACT

The present invention relates to a substrate-transporting device, including a base, a substrate carrier unit and a shaft unit mounted between the base and the substrate carrier unit. The shaft unit has a supporting shaft and a shaft base to support and control rotation of the substrate carrier unit. The substrate carrier unit includes a bottom carrier seat connected to the supporting shaft, a plurality of first supporting components mounted on a surface of the bottom carrier seat, a top carrier seat having a plurality of vacuum suction nozzles and a plurality of second supporting components, and at least a retractable component sandwiched between the top carrier seat and the bottom carrier seat. The top carrier seat is used to affix and detect the substrate. The retractable component is capable of adjusting the distance between the top carrier seat and the bottom carrier seat.

19 Claims, 6 Drawing Sheets

SUBSTRATE-TRANSPORTING DEVICE

BACKGROUND OF THE INVENTION

1. Field of the Invention

The present invention relates to a substrate-transporting device, and more particularly to a substrate-transporting device for large-sized glass substrates.

2. Description of Related Art

Figure 1A:
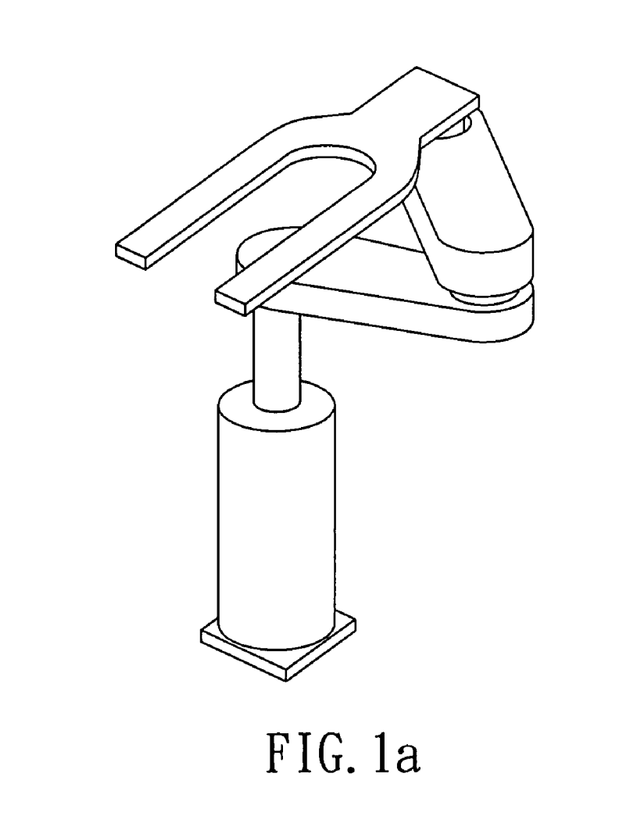
FIG. 1a is a perspective view of a conventional robot arm.
Figure 1B:
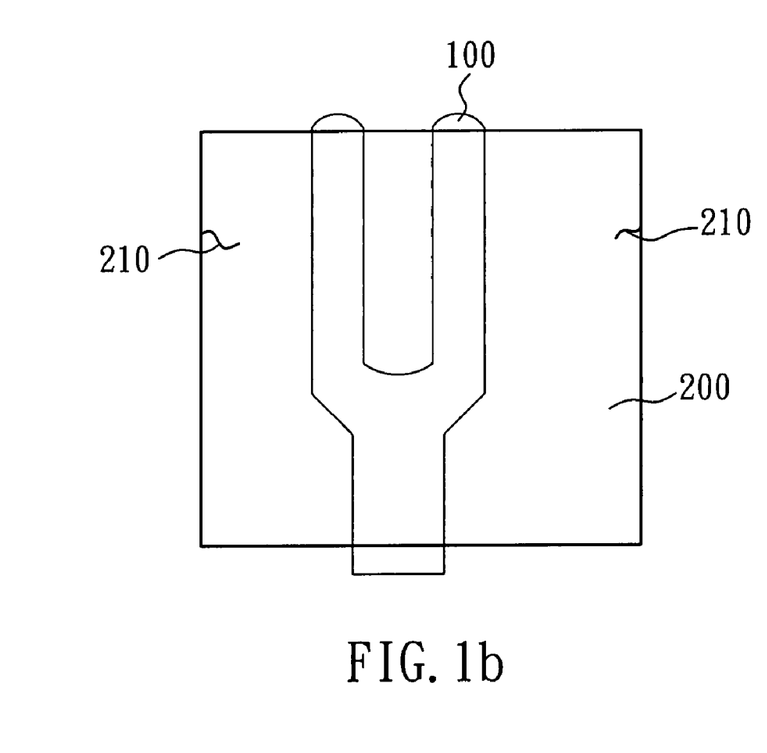
FIG. 1b is a schematic view of a conventional supporting fork for carrying a substrate.

In a fabricating process for liquid crystal display devices, a glass substrate is carried from a workplace to a fabricating apparatus by means of a transporting system such as a conventional system of a supporting fork and robot arm as shown in FIG. 1a. Recently, to reduce the fabrication cost of the liquid crystal display devices, it has been necessary to adopt large-sized glass substrates. Furthermore, to cooperate with such large-sized glass substrates, the way that the glass substrates enter the fabricating apparatus has been changed. A horizontal-type design to transport the glass substrates horizontally to the apparatus is generally used for the fabricating apparatus for small-size substrates. However, to efficiently utilize the space of a clean room, some of the fabricating apparatuses adopt a vertical-type design. Hence, the large-sized glass substrates tend to enter the apparatus in a vertical or tilted manner. As such, the conventional way using either the supporting fork or robot arm has encountered many technical difficulties. These technical difficulties are described as follows:

(1) A defect that occurs at the edge of the glass substrate fails to be detected. As shown in FIG. 1b, a supporting fork 100 has a small supporting surface so that it can't sufficiently cover the edge of a large-sized glass substrate 200. Thus, cracking defects 210 of the glass substrate cannot be effectively detected. These defects generally occur at the edge of the glass substrate. A large-sized glass substrate having such a defect would cause fragmentation when it is delivered into the fabricating apparatus. Once the fragmentation occurs, a large quantity of the glass fragments will stop the apparatus, and also, delay the fabrication process. In some serious cases, the fragments even will cause major damage to the apparatus.

(2) The fragments tend to easily occur when the glass substrate is transported into a loader of the fabricating apparatus adopting the vertical-type design. Because the conventional supporting fork is unable to position and align the posture of the glass substrates precisely, an auxiliary aligning mechanism is necessary to be mounted on the loader of the fabricating apparatus. This positioning issue can be easily solved for the small-size substrates and the horizontal-type fabricating apparatus. However, a slight deflection occurring somewhere in the large-sized substrates will accumulate and turn into an evident deflection at another position in the large-sized substrates. On the other hand, the glass substrate is not stably held by the loader of the vertical-type apparatus, so a cover plate or another protecting mechanism is provided to avoid the substrate from falling. Hence, the entrance is limited in size. Even if there is an alignment mechanism for the loader, the transporting system such as the fork will need to increase the precision of the position and posture alignments of the glass substrate. As a result, the conventional ways such as the supporting fork tend to cause the fragmentation.

(3) With the introduction of the fifth generation fab, both the horizontal type and vertical type fabricating apparatuses are applied and arranged randomly to a single production line. Hence, there is a dire need to provide a single transporting system capable of transporting glass substrates to either the horizontal type fabricating apparatus or the vertical type fabricating apparatus. So far, various transporting systems are used in fabricating process. Thus, the maintenance cost and time of these various transporting systems as well as the fabrication cost are all increased.

Therefore, it is desirable to provide an improved substrate-transporting device to mitigate and/or obviate the aforementioned problems.

SUMMARY OF THE INVENTION

A primary object of the present invention is to provide a substrate-transporting system so as to actually detect defects of a substrate and align the position of the substrate, avoid fragmentation of the substrate from occurring, transport the substrate in a tilted manner and save space for transporting the substrate.

Another object of the present invention is to provide a substrate-transporting device for a single transporting system to transport a glass substrate effectively in a vertical, tilted or horizontal manner. To attain the aforesaid objects, the substrate-transporting device according to the present invention comprises a base; a shaft unit having a supporting shaft and a shaft base where an end of the supporting shaft is pivotally connected to the shaft base mounted on the base to support and control rotation of the supporting shaft; and a substrate carrier unit fixedly mounted at the other end of the supporting shaft and supported by the supporting shaft. The substrate carrier unit comprises a bottom carrier seat connected to the supporting shaft, a plurality of first supporting components mounted on a surface of the bottom carrier seat, a top carrier seat mounted opposed to the side of the bottom carrier seat where the supporting shaft is located, a plurality of second supporting components mounted on an inner side of the top carrier seat, and at least a retractable component sandwiched between the top carrier seat and the bottom carrier seat; wherein a plurality of vacuum suction nozzles for affixing the substrate are disposed on a surface of the top carrier seat and the retractable component adjusts the distance between the top carrier seat and the bottom carrier seat so that the first supporting components are located between the top carrier seat and the bottom carrier seat or that the first supporting components project out of the surface of the top carrier seat to support the substrate. As such, the shaft base is capable of indirectly controlling a tilted angle of the substrate carrier unit by controlling rotation of the supporting shaft.

In a substrate-transporting device according to the present invention, the base can be a conventional one, and preferably is a movable base fixed on a conveying belt or a base having both power and detecting components to be guided (e.g., by using laser or electronic signals) for moving the whole substrate-transporting device. In addition, the base preferably includes a movable positioning unit perpendicular to the ground or a rotationally movable positioning unit for controlling and adjusting the height and rotation angle of the substrate-transporting device. In a substrate-transporting device according to the present invention, the model of the first supporting components is not specifically defined, and can be a conventional one capable of securely supporting the substrate. Preferably, the first supporting components are pins. The second supporting components are capable of providing the function of support or transportation of substrates, and preferably, they are rollers. The positions and the quantities of the first and the second supporting components are not specifically defined so long as these are capable of moving between two sides of the top carrier seat. Preferably, the first and the second supporting components are uniformly disposed on one side of the substrate. The positions of the first supporting components are adjusted by means of the retractable component that is sandwiched between the top carrier seat and the bottom carrier seat. The second supporting components, of which positions are controlled by means of springs, are mounted on the inner side of the top carrier seat with a floating holder. In a substrate-transporting device according to present invention, it is preferable that the retractable component is a retractable cylinder. In a substrate-transporting device according to present invention, an inert gas flows inside the vacuum suction nozzles to control the inner pressure of the vacuum suction nozzles. Preferably, the gas flowing inside the vacuum suction nozzles is nitrogen. In addition, the distribution area of the vacuum suction nozzles on the top carrier seat is not specifically defined. Preferably, this distribution area is similar to the size of the substrate. More preferably, vacuum slits circumscribing and extending through the vacuum suction nozzles are further provided and disposed relative to the four peripheries of the substrate to actually detect defects of the substrate, especially those at the edge of the substrate. A substrate-transporting device according to the present invention further comprises a plurality of sets of positioning and transporting components mounted around the top carrier seat to align the position of the substrate, where at least of one set of the positioning and transporting components preferably includes a tooth belt, a set of driving and passive rotating wheels for actuating the tooth belt to roll, a motor for actuating the driving wheel to rotate, and a plurality of positioning wheels fixedly mounted on the tooth belt for driving movement of the substrate in the substrate carrier unit so as to transport the substrate to another apparatus. In addition, the positioning and transporting components preferably further comprise a plurality of cylinders to control the distance of the positioning and transporting components from the top carrier seat. It is preferable for the shaft unit to further include a motor connected to the supporting shaft to provide the substrate carrier unit with power for movement when necessary. More preferably, the shaft unit further includes a limiting hole on the shaft base to limit a tilt angle of the substrate carrier unit and prevent the substrate from an inadvertent fall as a result of over-tilt.

Other objects, advantages, and novel features of the invention will become more apparent from the following detailed description when taken in conjunction with the accompanying drawings.

DETAILED DESCRIPTION OF THE PREFERRED EMBODIMENT

A preferred embodiment of a substrate-transporting device will be described with reference to the accompanying drawings for illustrating the present invention.

Figure 2:
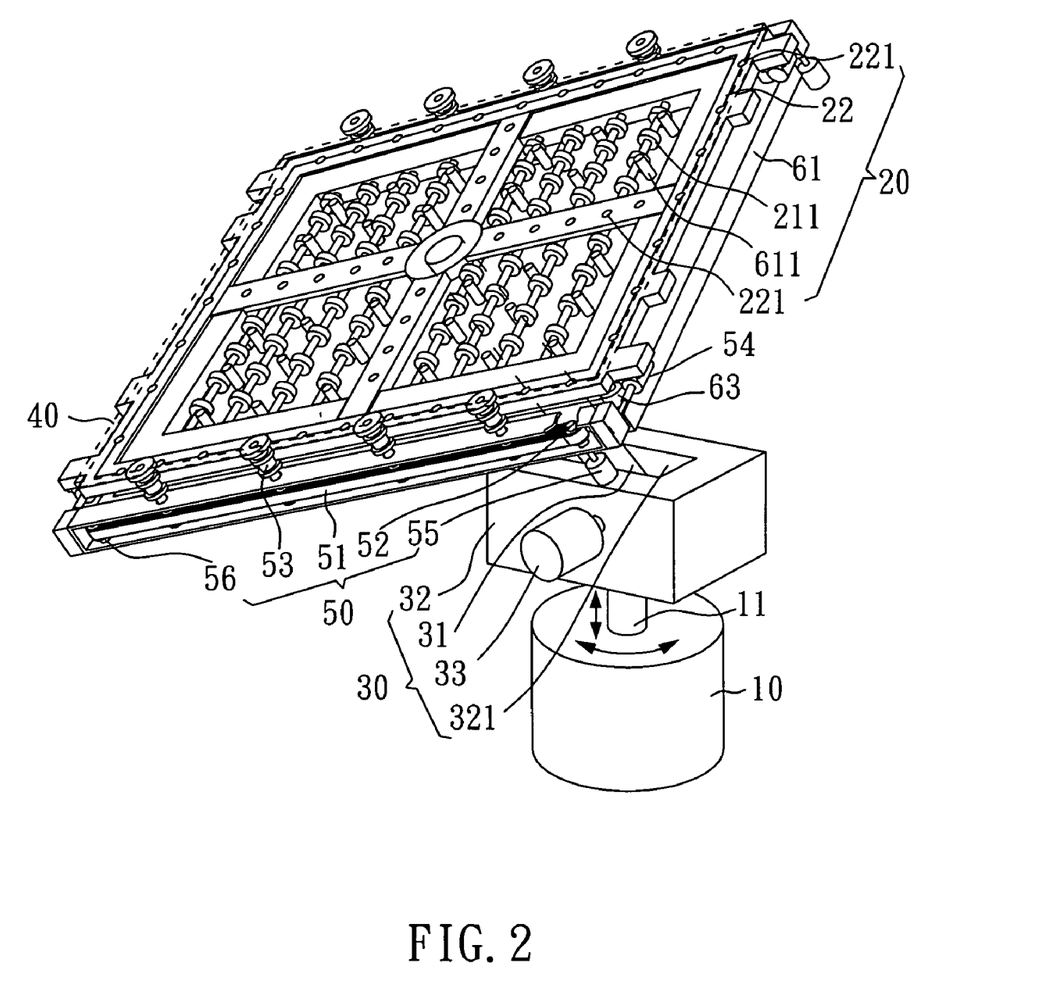
FIG. 2 is a perspective view of an assembled substrate-transporting device according to a preferred embodiment of the present invention.

Referring to FIG. 2, a perspective view of an assembled substrate-transporting device according to a preferred embodiment of the present invention is shown. A substrate-transporting device of the present invention comprises a base 10, a substrate carrier unit 20 and a shaft unit 30. In this preferred embodiment, the base 10 is a movable base fixedly mounted on a conveying belt (not shown), being guided to move the whole substrate-transporting device. Thus, a substrate 40 is moved to a required position. There are driving components such as a rotating motor or gears inside the base 10 so that the moving shaft 11 projecting from the inner portion of the base 10 is capable of not only adjusting the height but also the angle of the substrate carrier unit 20. Hence, the shaft unit 30 connected to the moving shaft 11 can be moved variably.

Figure 3:
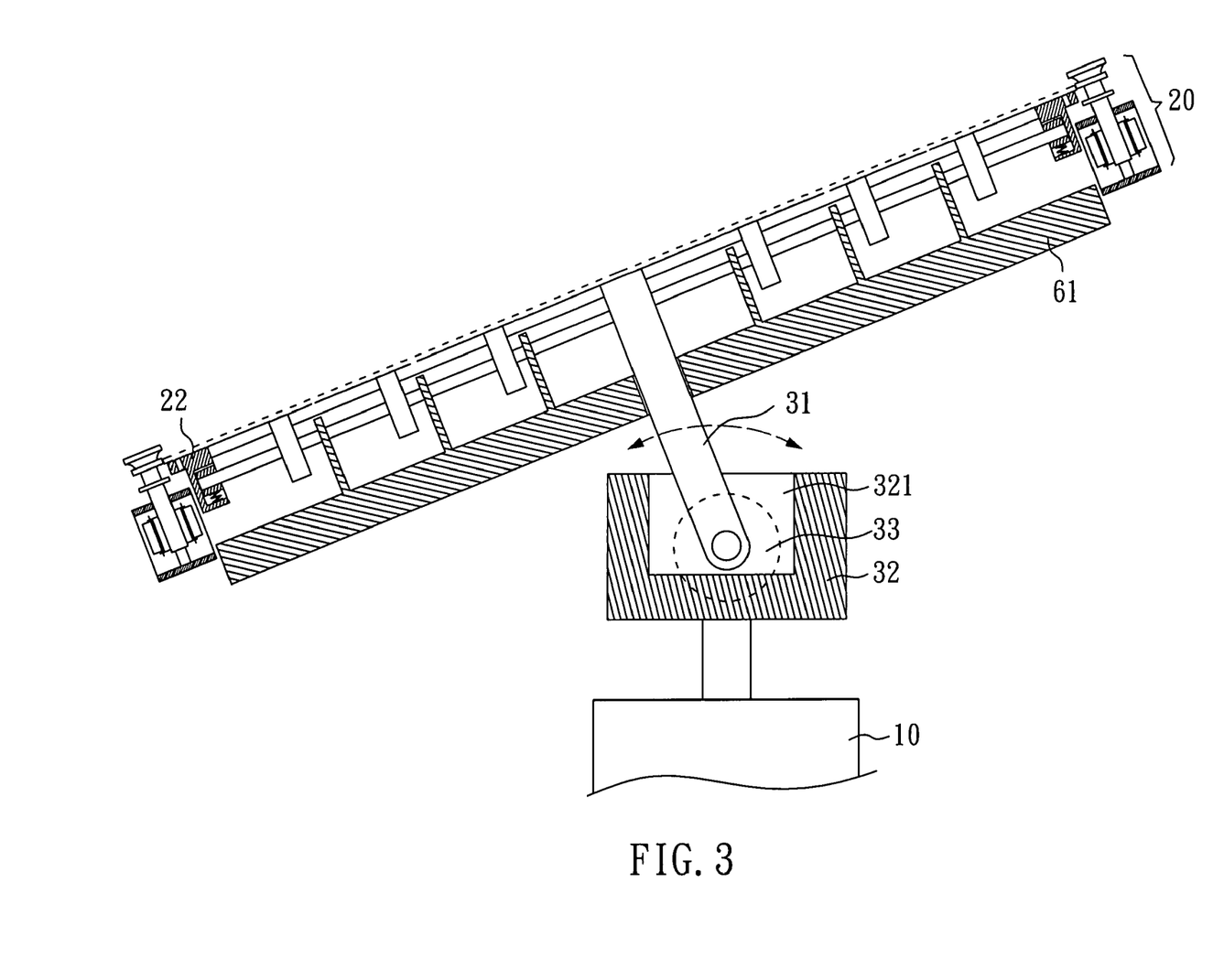
FIG. 3 is a cross-sectional view of an assembly according to the preferred embodiment of FIG. 2.

The shaft unit 30 has a supporting shaft 31 and a shaft base 32 pivotally connected to the lower end of the supporting shaft 31, the shaft base 32 having a limiting hole 321 for limiting the angle of the supporting shaft 31 so that a tilted angle of the whole substrate carrier unit 20 is limited. It is inferable from the side view of FIG. 3, when the supporting shaft 31 rotates to a predetermined angle (that is, the substrate carrier unit 20 inclines to a predetermined angle), movement of the supporting shaft 31 will be restricted by the limiting hole 321. Accordingly, a tilted angle of the substrate carrier unit 20 is controlled. Also, the supporting shaft 31 is connected to a motor 33 (a circle in dotted line as shown in FIG. 3) to provide necessary power for the tilted movement. As shown in both FIGS. 2 and 3, the shaft base 32 and the limiting hole 321 are capable of supporting and adjusting a tilted direction and angle of the substrate carrier unit 20 by means of the motor 33.

Figure 4:
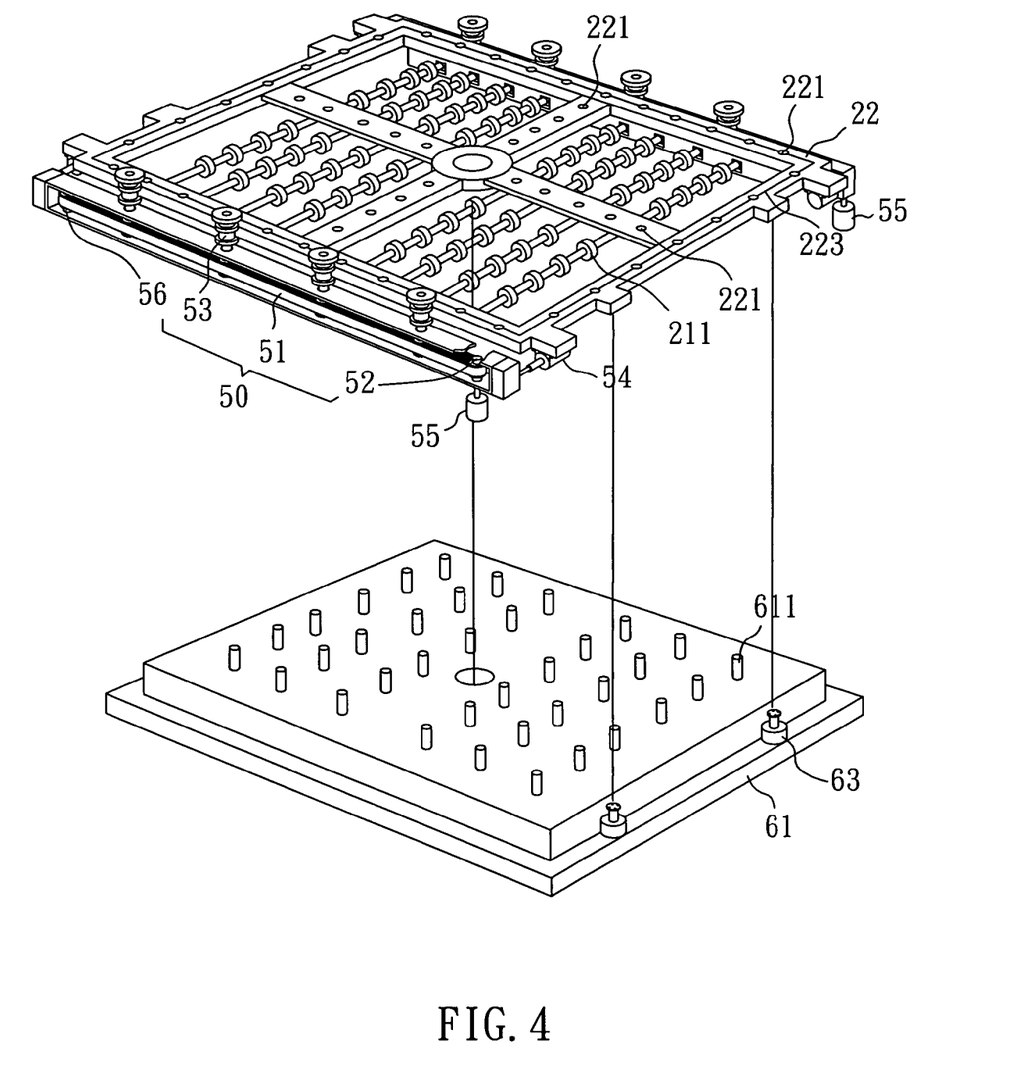
FIG. 4 is an explosive view of a substrate carrier unit according to a preferred embodiment of the present invention.

The substrate carrier unit 20 is fixedly mounted on the upper end of the supporting shaft 31 and supported by the supporting shaft 31. Reference is also made to FIG. 4, an exploded view of the substrate carrier unit 20 according to a preferred embodiment of the present invention is shown. The substrate carrier unit 20 includes a bottom carrier seat 61 connected to the supporting shaft 31, a plurality of first supporting components 611 mounted on the surface of the bottom carrier seat 61, a top carrier seat 22 mounted on the upper side of the bottom carrier seat 61, a plurality of second supporting components 221 mounted on the inner side of the top carrier seat 22, and a plurality of retractable components 63 that are sandwiched between the top carrier seat 22 and the bottom carrier seat 61. In this preferred embodiment, the first supporting components are pins while the second supporting components 211 include rollers. The first supporting components 611 are used to support the substrate and transport the substrate to the top carrier seat 22 in transporting the substrate. The second supporting components 211 are capable of supporting the substrate in an elastic manner and rolling to facilitate transportation of the substrate. In addition, plural vacuum suction nozzles 221 are disposed on the surface of the top carrier seat 22 to suck the substrate 40 on the top carrier seat 22. Moreover, slot-shaped vacuum slits 223 are disposed among the vacuum suction nozzles 221 on the surface of the top carrier seat 22 at the outer edge of the substrate 40, having both a vacuum sucking function and a complete detection of the periphery of the substrate 40. In this preferred embodiment, the distribution of the vacuum slits 223 connected to the vacuum suction nozzles 221 approaches to the size of the substrate 40. Hence, a cracking defect usually found at the periphery of the substrate 40 can be actually detected. An inert gas, preferably nitrogen, flows inside the vacuum suction nozzles 221 and the vacuum slits 223 to control the inner pressure of the vacuum suction nozzles 221 and the vacuum slits 223. The abnormal inner pressure can be used to determine the cracking defect. The retractable components 63 are capable of adjusting the distance between the top carrier seat 22 and the bottom carrier seat 61. The first supporting components are thus adjusted to be between the bottom carrier seat 61 and the top carrier seat 22; or alternatively, the first supporting components 611 project out of the surface of the top carrier seat 22 to support the substrate 40. In this preferred embodiment, four retractable components 63 disposed symmetrically (only two of them shown in FIG. 4) are retractable cylinders to control the up-and-down movements of the bottom carrier seat 61 and those of the first supporting components 611. Of course, the up-and-down movement of the related substrate 40 can be well controlled through the retractable cylinders by the assistance of the bottom carrier seat 61 and the first supporting components 611 in this preferred embodiment.

Figure 5A:
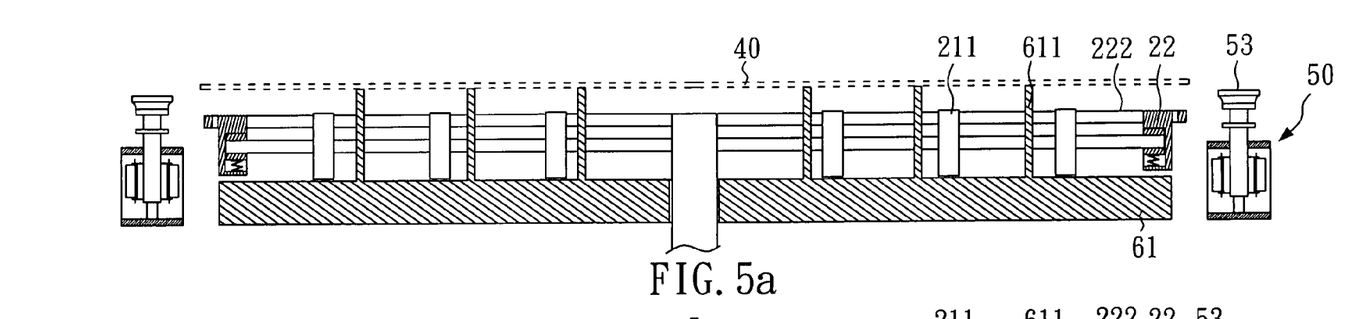
FIGS. 5a through 5c are cross-sectional views illustrating motions of a preferred embodiment of the present invention.
Figure 5B:
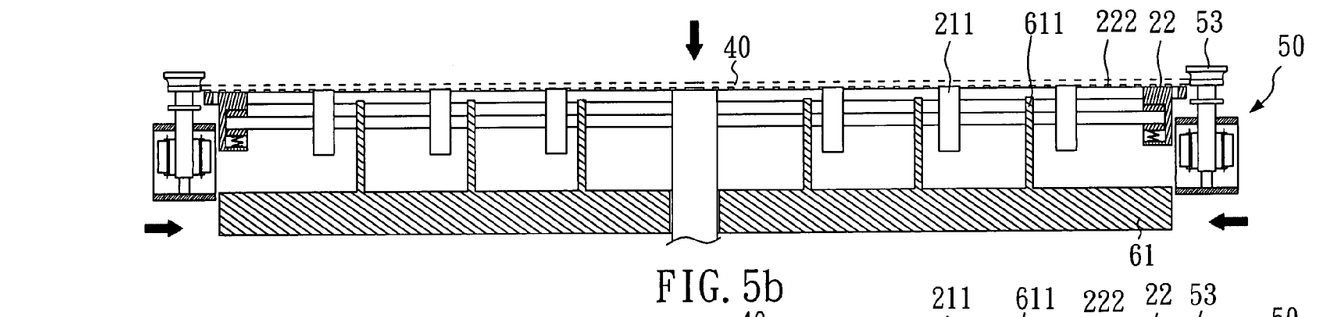
Figure 5C:
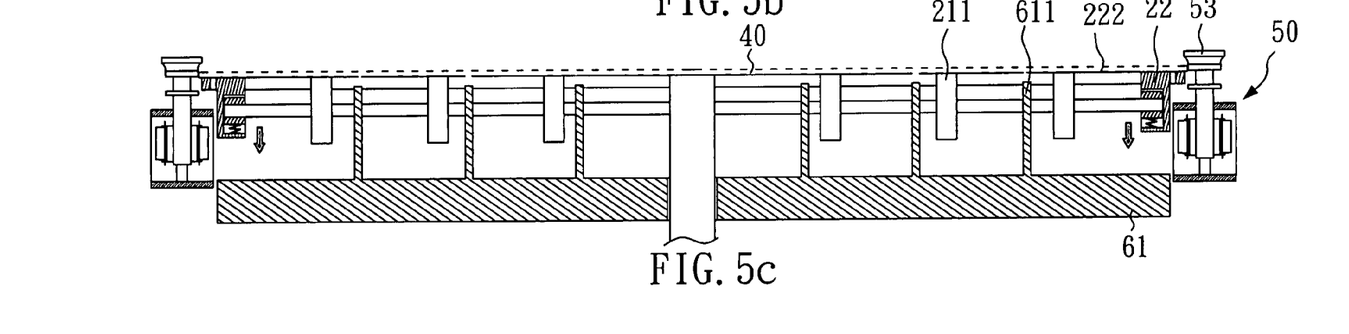
Figure 6:
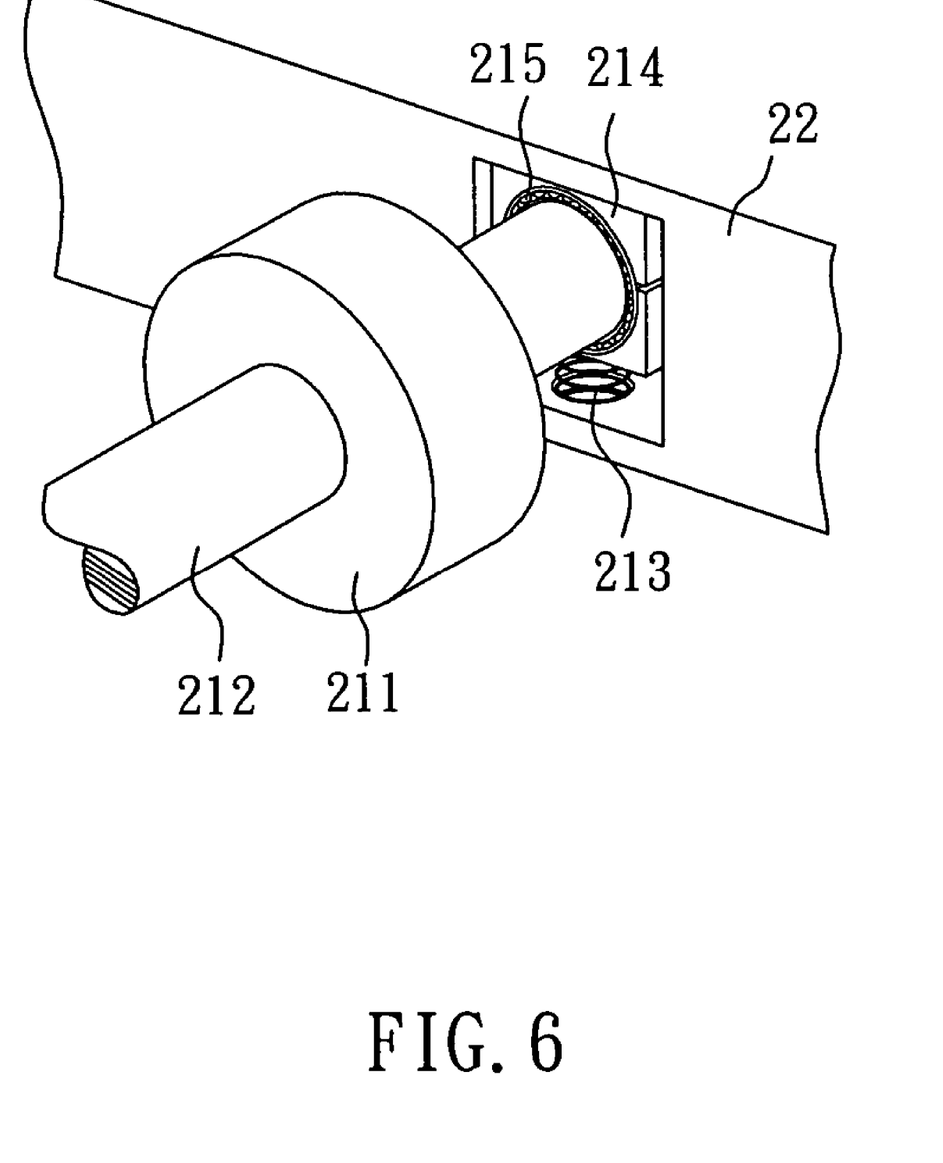
FIG. 6 is a perspective view of a second supporting component according to a preferred embodiment of the present invention.

In this preferred embodiment, the substrate-transporting device also includes a plurality of positioning and transporting components 50 disposed around the top carrier seat 22 to align the position of the substrate and transport the substrate to another apparatus or device. The positioning and transporting components 50 are composed of a tooth belt 51, a driving wheel 52, a passive rotating wheel 56, and positioning wheels 53 mounted on the tooth belt 51. A motor 55 connected to the driving wheel 52 can drive motions of the driving wheel 52, the passive rotating wheel 56 and the tooth belt 51, and then the positioning wheels 53 are thus driven to rotate. The positioning and transporting components 50 are controlled by means of at least a cylinder 54 to move close to or away from the top carrier seat 22. When the substrate 40 enters the substrate-transporting device, the retractable components are adjusted to make the first supporting components 611 projected out of the surface of the top carrier seat 22 so that the substrate 40 is supported by the first supporting components 611, as shown in FIG. 5a. Then, referring to FIG. 5b, the retractable components 63 are adjusted again to have pins (that is the first supporting components 611) descended to the location below the upper surface 222 of the top carrier seat 22, and also, the positioning and transporting components 50 are controlled by the cylinder 54 (as shown in FIG. 2) to move close to each other from the two opposed sides of the substrate 40. Thus, the substrate 40 is aligned to a predetermined position by pressing the positioning wheels 53 firmly on the both sides of the substrate 40, and being mounted on the second supporting components (i.e., rollers) 211. So far, the substrate 40 is loaded on the substrate-transporting device through contacting the second supporting components (i.e. rollers) 211 at positions slightly above the upper surface 222 of the top carrier seat 22. Referring to FIG. 5c, the aligned substrate 40 above the upper surface 222 of the top carrier seat 22 then descends gradually to the upper surface 222 of the top carrier seat 22 by the suction effect of the vacuum suction nozzle 221 and the vacuum slits 223 defined in the upper surface 222 of the top carrier seat 22. As the substrate 40 is sucked through the vacuum suction nozzles 221 and the vacuum slits 223, the weight of the substrate 40 and the sucking forces from the vacuum suction nozzles 221 and the vacuum slits 223 can overcome the elastic forces of the second supporting components (i.e. rollers) 211 and make the second supporting components (i.e. rollers) 211 descend to positions below the upper surface 222 of the top carrier seat 22. Finally, the substrate 40 will contact the upper surface 222 of the top carrier seat 22 and the possible cracking defects of the substrate will be detected by abnormal pressure of vacuum suction nozzles 221 and vacuum slit 222. Thus, the substrate 40 is supported by the top carrier seat 22, and is sucked by means of the vacuum suction nozzles 221 and the vacuum slits 223 defined in the upper surface 222 of the top carrier seat 22. A more detailed description of the connecting structure of the second supporting components 221 according to this preferred embodiment will be made with reference to FIG. 6. A wheel shaft stand 212 for supporting the second supporting components (i.e., the rollers) 211 is fixed to the inner portion of a floating holder 214 via a bearing 215. The position of the floating holder 214 on the top carrier seat 22 is controlled by means of a spring 213. Hence, when the substrate descends to be sucked by the vacuum suction nozzles 221 and the vacuum slits 223, the second supporting components (i.e., the rollers) 211 descend under the combined effect of weight of the substrate 40 and the sucking forces of the vacuum suction nozzles 221 and the vacuum slits 223. Thus, the substrate 40 contacts closely with the top carrier seat 22. If the substrate 40 is detected as abnormal, for example, a crack defect exists at the periphery of the substrate, the next processing step will be stopped so as to avoid the substrate 40 from cracking and prevent the fabricating apparatus from being contaminated. If the substrate 40 is normal after detection, the vacuum suction nozzles 221 and the vacuum slits 223 suck the substrate 40. Actually, the way that the substrate is carried and transported depends on the purpose of the next processing step (for example, both the substrate carrier unit 20 and the substrate 40 mounted thereon are tilted in order to transport the substrate 40 to the fabricating apparatus). In this preferred embodiment, the second supporting components 211 of the substrate-transporting device are the rollers. Thus, when the substrate 40 is transported into the fabricating apparatus, the vacuum suction nozzles 221 and the vacuum slits 223 will be shifted to a non-vacuum state. Thus, the substrate 40 will slightly float up to positions above the upper surface 222 of the top carrier seat 22 since the elastic force of the second supporting components 211 (i.e., the rollers) overcome the gravity of the substrate 40. Then, only the substrate is moved into the fabricating apparatus by means of the positioning wheels 53 on the positioning and transporting components 50 with assistance of the second supporting components (i.e., the rollers) 211.

The substrate-transporting device of the present invention is capable of actually detecting defects of the substrate, especially defects at the periphery of the substrate, aligning the position of the substrate, avoiding the substrate from causing fragmentation easily or preventing a defective substrates such as the substrate having a crack at the periphery thereof from entering the fabricating apparatus. Thus, fragments of the substrate in the fabricating apparatus and contamination of the apparatus are prevented. In addition, the substrate-transporting device of the present invention is capable of precisely aligning the position of the substrate.

The large-sized substrate can be safely transported into the fabricating apparatus in a tilted manner to save space required for transporting the substrate.

Although the present invention has been explained in relation to its preferred embodiment, it is to be understood that many other possible modifications and variations can be made without departing from the spirit and scope of the invention as hereinafter claimed.

What is claimed is:

1. A substrate-transporting device, comprising:
   a base;
   a shaft unit having a supporting shaft and a shaft base, wherein a first end of said supporting shaft is pivotally connected to said shaft base mounted on said base to support and control rotation of said supporting shaft; and
   a substrate carrier unit fixedly mounted at a second end of said supporting shaft and supported by said supporting shaft, comprising:
   a bottom carrier seat connected to said supporting shaft;
   a plurality of first supporting components mounted on a surface of said bottom carrier seat;
   a top carrier seat mounted opposed to the side of said bottom carrier seat where said supporting shaft is located;
   a plurality of second supporting components mounted on an inner side of said top carrier seat; and
   at least a retractable component sandwiched between said top carrier seat and said bottom carrier seat; wherein a plurality of vacuum suction nozzles are disposed on a surface of said top carrier seat, and said retractable component selectively adjusts the distance between said top carrier seat and said bottom carrier seat so that said first supporting components are located between said top carrier seat and said bottom carrier seat and that said first supporting components project out of the surface of said top carrier seat to support a substrate;
   wherein said shaft base is capable of indirectly controlling a tilted angle of said substrate carrier unit by controlling rotation of said supporting shaft, and said top carrier seat having a vacuum slit disposed on the surface of said top carrier seat relative to the periphery of said substrate.

2. The substrate-transporting device of claim 1, wherein said base is movable.

3. The substrate-transporting device of claim 1, wherein said first supporting components are pins to support said substrate.

4. The substrate-transporting device of claim 3, wherein said first supporting components are uniformly disposed on one side of said substrate.

5. The substrate-transporting device of claim 1, wherein said second supporting components having a plurality of rollers to support said substrate.

6. The substrate-transporting device of claim 1, further comprising a plurality of floating holders mounted at positions inside said top carrier seat in contact with said second supporting components.

7. The substrate-transporting device of claim 1, wherein said retractable component is a retractable cylinder.

8. The substrate-transporting device of claim 1, wherein a nitrogen gas flows in said vacuum suction nozzles to control the inner pressure of said vacuum suction nozzles.

9. The substrate-transporting device of claim 1, further comprising a plurality of sets of positioning and transporting components mounted around said top carrier seat to align the position of said substrate.

10. The substrate-transporting device of claim 9, wherein at least one of said sets of positioning and transporting components includes a tooth belt, a set of driving and passive rotating wheels for actuating said tooth belt to roll, a motor for actuating said driving wheel to rotate, and a plurality of positioning wheels fixedly mounted on said tooth belt.

11. The substrate-transporting device of claim 9, further comprising a plurality of cylinders to control the distance of said positioning and transporting components from said top carrier seat.

12. The substrate-transporting device of claim 1, wherein said vacuum slit disposed on said top carrier seat is integrally formed with said vacuum suction nozzles relative to the periphery of said substrate.

13. The substrate-transporting device of claim 1, wherein said shaft unit further comprises a motor connected to said supporting shaft to provide said substrate carrier unit with power for movement.

14. The substrate-transporting device of claim 1, wherein said shaft unit further comprises a limiting hole on said shaft base to limit a tilted angle of said substrate carrier unit.

15. The substrate-transporting device of claim 1, wherein said base further includes a movable positioning unit perpendicular to the ground or a rotationally movable positioning unit for controlling and adjusting the height or rotation angle of said substrate-transporting device.

16. A substrate-transporting device, comprising:
   a base;
   a shaft unit having a supporting shaft and a shaft base, wherein a first end of said supporting shaft is pivotally connected to said shaft base mounted on said base to support and control rotation of said supporting shaft; and
   a substrate carrier unit fixedly mounted at a second end of said supporting shaft and supported by said supporting shaft, comprising:
   a bottom carrier seat connected to said supporting shaft;
   a plurality of first supporting components mounted on a surface of said bottom carrier seat;
   a top carrier seat mounted opposed to the side of said bottom carrier seat where said supporting shaft is located;
   a plurality of second supporting components mounted on an inner side of said top carrier seat;
   at least a retractable component sandwiched between said top carrier seat and said bottom carrier seat; wherein a plurality of vacuum suction nozzles are disposed on a surface of said top carrier seat, and said retractable component selectively adjusts the distance between said top carrier seat and said bottom carrier seat so that said first supporting components are located between said top carrier seat and said bottom carrier seat and that said first supporting components project out of the surface of said top carrier seat to support a substrate;
   wherein said shaft base is capable of indirectly controlling a tilted angle of said substrate carrier unit by controlling rotation of said supporting shaft; and
   a plurality of sets of positioning and transporting components mounted around said top carrier seat to align the position of said substrate, wherein each set of positioning and transporting components includes a tooth belt, a set of driving and passive rotating wheels for actuating said tooth belt to roll, a motor for actuating said driving wheel to rotate, and a plurality of positioning wheels fixedly mounted on said tooth belt.

17. The substrate-transporting device of claim 16, further comprising a plurality of cylinders to control the distance of said positioning and transporting components from said top carrier seat.

18. The substrate-transporting device of claim 16, further comprising a vacuum slit disposed on the surface of said top carrier seat relative to the periphery of said substrate.

19. The substrate-transporting device of claim 18, wherein said vacuum slit disposed on said top carrier seat is integrally formed with said vacuum suction nozzles relative to the periphery of said substrate.

* * * * *